(12) United States Patent
Barth et al.

(10) Patent No.: US 8,302,554 B2
(45) Date of Patent: Nov. 6, 2012

(54) APPARATUS AND METHOD FOR RAPID COOLING OF LARGE AREA SUBSTRATES IN VACUUM

(75) Inventors: Kurt L. Barth, Fort Collins, CO (US); Robert A. Enzenroth, Fort Collins, CO (US); Walajabad S. Sampath, Fort Collins, CO (US)

(73) Assignee: Colorada State University Research Foundation., Ft. Collins, CO (US)

( * ) Notice: Subject to any disclaimer, the term of this patent is extended or adjusted under 35 U.S.C. 154(b) by 253 days.

(21) Appl. No.: 12/861,391

(22) Filed: Aug. 23, 2010

(65) Prior Publication Data

US 2010/0314076 A1   Dec. 16, 2010

Related U.S. Application Data

(63) Continuation of application No. 11/525,456, filed on Sep. 22, 2006, now Pat. No. 7,803,419.

(51) Int. Cl.
*B05C 11/00* (2006.01)
*B05C 13/00* (2006.01)
*B05C 13/02* (2006.01)
*B05C 21/00* (2006.01)
*C23C 16/00* (2006.01)
*C23F 1/00* (2006.01)
*H01L 21/306* (2006.01)
*B05D 3/00* (2006.01)
*F26B 7/00* (2006.01)

(52) U.S. Cl. .......... 118/69; 118/500; 118/715; 118/716; 118/724; 118/725; 427/398.1; 156/345.27; 156/345.37; 156/345.53; 34/433; 165/80.1

(58) Field of Classification Search ............. 118/69, 118/500, 715, 716, 724, 725; 156/345.27, 156/345.37, 345.53; 34/433; 165/80.1
See application file for complete search history.

(56) References Cited

U.S. PATENT DOCUMENTS

| | | | |
|---|---|---|---|
| 4,194,233 A * | 3/1980 | Jones et al. ............ 269/20 |
| 4,909,314 A * | 3/1990 | Lamont, Jr. ............ 118/725 |
| 5,181,556 A * | 1/1993 | Hughes ............ 165/80.1 |
| 6,250,374 B1 * | 6/2001 | Fujino et al. ............ 165/80.1 |
| 6,423,565 B1 | 7/2002 | Barth et al. |
| 6,483,081 B1 | 11/2002 | Batchelder |
| 6,907,924 B2 | 6/2005 | Moslehi |
| 2003/0029610 A1 | 2/2003 | Moslehi |
| 2004/0250996 A1 * | 12/2004 | Yi et al. ............ 165/86 |
| 2005/0252227 A1 | 11/2005 | Rogers et al. |
| 2007/0140671 A1 | 6/2007 | Yoshimura |
| 2007/0209591 A1 | 9/2007 | Nagaike et al. |
| 2007/0254493 A1 | 11/2007 | Salinas et al. |
| 2008/0075853 A1 | 3/2008 | Barth et al. |

* cited by examiner

*Primary Examiner* — Dah-Wei Yuan
*Assistant Examiner* — Binu Thomas
(74) *Attorney, Agent, or Firm* — Cooley LLP

(57) ABSTRACT

The present invention is directed to an apparatus and method for rapid cooling of a large substrate in a vacuum environment. A first cooled plate is brought into close proximity with one surface of a flat substrate. The spatial volume between the first cooling plate and the substrate is sealed and brought to a higher pressure than the surrounding vacuum level to increase the cooling efficiency. A second cooled plate is brought into close proximity with the opposite surface of the flat substrate. A second spatial volume between the second cooling plate and the substrate is sealed and the gas pressure is equalized to the gas pressure in the first spatial volume. The equalization of the gas pressure on both sides of the flat substrate eliminates deflection of the substrate and bending stress in the substrate.

19 Claims, 2 Drawing Sheets

APPARATUS AND METHOD FOR RAPID COOLING OF LARGE AREA SUBSTRATES IN VACUUM

CROSS-REFERENCE TO RELATED CASES

This U.S. patent application is a continuation application of U.S. application Ser. No. 11/525,456 filed Sep. 22, 2006, now U.S. Pat No. 7,803,419, and entitled APPARATUS AND METHOD FOR RAPID COOLING OF LARGE AREA SUBSTRATES IN VACUUM, which is incorporated herein by reference

STATEMENT REGARDING FEDERAL RIGHTS

This invention was made with government support under grant number DE-AC36-99GO10337, awarded by the Department of Energy. The government has certain rights in the invention.

GOVERNMENT SUPPORT

This invention was made with Government support under grants awarded by the National Renewable Energy Laboratory. The Government has certain rights in this invention.

FIELD OF THE INVENTION

The present invention relates to semiconductor processing. In particular, but not by way of limitation, the present invention relates to systems and methods for cooling large area substrates in vacuum.

BACKGROUND OF THE INVENTION

One semiconductor process in which substrate temperature is critical is thin film deposition in vacuum. The substrate temperature has a large effect on the thin film deposition process and the quality of the resulting films. One known thin film semiconductor device is a CdS/CdTe photovoltaic (PV) module. This device has thin films of CdS and CdTe semiconductors on a soda lime glass substrate. A known configuration for a CdS/CdTe PV module is the back wall or superstrate configuration. In this configuration, the soda lime superstrate (referred to in all other cases described hereinafter as the substrate) is most commonly coated with a transparent conductive oxide (TCO) film onto which the other films are deposited in the following order: a) a CdS film; b) a CdTe film; c) an ohmic contact layer; and d) a back electrode layer. Along with these film depositions, several heat treatment steps are also required to enhance device properties. It has been found that in order to produce the optimum CdS/CdTe PV device using a process such as that described in U.S. Pat. No. 6,423,565 it is desirable to cool the soda lime glass substrate and the adherent TCO/CdS/CdTe films to about 25° C. before applying the ohmic contact layer. The soda lime glass substrate reaches temperatures on the order of 200° C. in the previous processing step. It would be desirable to provide an apparatus for cooling the soda lime glass substrate from about 200° C. to 25° C. in a time period of 2-4 minutes with the substrate maintained in the vacuum chamber at a process pressure of about 40 mTorr. In the past, a time period on the order of hours was required to cool the substrate to the optimal temperature by relying on radiation cooling alone.

In order for this prior art CdS/CdTe PV module to serve as a practical low cost energy conversion device for converting sunlight into electricity, the soda lime glass substrate must be of a large size. Known CdS/CdTe PV modules are fabricated in a nominal 2 ft.×4 ft. size. The CdS/CdTe PV module must also be capable of being manufactured at the lowest possible cost and at a high volume throughput.

There are three possible physical mechanisms for cooling an object: 1) convective cooling resulting from movement of the surrounding gas (this gas movement can be natural due to density changes in the gas or may be forced, for example, by a fan); 2) conductive cooling resulting from direct contact of the object with a colder surface (conduction can be assisted by a contact medium including a thin layer of gas); and 3) electromagnetic radiation of thermal energy to colder surroundings. In the case of a hot object with no cold surfaces in close contact, only radiation cooling is effective at vacuum pressures. The rate of radiation cooling is governed by the difference in temperature between the hot object and the colder surroundings. The thermal radiation cooling rate is proportional to the quantity $T_{hot}^4 - T_{cold}^4$. Thus, the cooling rate is quite slow in the practical case of a semiconductor substrate below 200° C. surrounded by colder surfaces at 25° C. at some finite distance away and with an intervening ambient at vacuum pressures of 40 mTorr.

There are known methods in the prior art for cooling substrates in vacuum by using gas phase conductive cooling in combination with a cold surface in close proximity. U.S. Pat. No. 6,907,924 to Moslehi, for example, teaches the use of a thin heat transfer region between the substrate and the substrate holder or wafer chuck. Gas flowing through these thin heat transfer regions is the transfer medium employed to either heat or cool the substrate in a vacuum. The planar surface of the substrate holder may be heated or cooled, as desired. The prior art teaches heat transfer through a thin heat transfer region on only one side of the substrate. This teaching is disadvantageous when attempting to cool large area substrates, such as those employed in the apparatus and process of the present invention. In order to cool a 4-mm thick soda lime glass substrate from 200 C to 25 C in a period of 2 minutes, it has been found that the pressure in the intervening thin heat transfer region must be on the order of 10 Torr. In order to bring the gas pressure to this level it is necessary to seal the edges of the thin heat transfer region. It has also been found that the cooling rate of the substrate is a function of the spacing between the substrate and the cooled plate. For spacing distances larger than 0.005 in., the cooling rate rapidly drops to zero. If 10 Torr of pressure is applied to only one side of a large area soda lime glass substrate and the ambient processing pressure on the opposite side of the substrate is 40 mTorr or essentially zero, a considerable amount of deflection of the substrate will occur. This deflection also introduces stress and may lead to breakage of the substrate. Using equations from a standard reference such as the "Machinery's Handbook", 24$^{th}$ addition, published by Industrial Press Inc. New York, ISBN 0-8311-2492-X, it is possible to estimate the deflections and stresses in flat plates subjected to an evenly distributed load such as gas pressure. Given a 2 ft.×4 ft. panel of soda lime glass clamped top and bottom on all edges and a pressure of 10 Torr applied to one side only, the maximum deflection will be approximately 0.220 in. at the center of the panel. This degree of deflection will drive the heat transfer rate to zero over much of the panel area. In addition, the introduced stress for the same case will be approximately 2900 psi, which exceeds the 0.8% breakage design.

Thus, the prior art substrate cooling methods are ineffective to provide high throughput, low cost cooling of large area substrates in vacuum without the risk of damaging the substrates or their adherent films.

SUMMARY OF THE INVENTION

The present invention is directed to an apparatus and method for cooling large area CdS/CdTe photovoltaic modules or other large area substrates, such as those used for flat panel displays, during vacuum processing.

In accordance with the present invention, it is desirable not to disturb the ambient process gas conditions, including the vacuum pressure level and the purity of the process gas. In addition, it is desirable to avoid spikes in the vacuum pressure as the substrate enters and exits the cooling process. In order to prevent contamination of the process gas and to lower costs, it is desirable to utilize the same gas as both the process ambient gas and the cooling gas. A preferred process gas for the production of CdS/CdTe photovoltaic modules is dry nitrogen. Trace amounts of other gases may also be introduced, but the main component of the background ambient gas is preferred to be inert nitrogen.

In accordance with one aspect of the present invention, a sealed gas volume is provided between a cooling plate and one surface of the planar substrate. This sealed gas volume may be maintained at a higher pressure than the surrounding processing ambient pressure. The sealed gas volume is very thin in the dimension between the cooling plate and the substrate. The gas volume extends nearly to the edges of the substrate.

In accordance with another aspect of the present invention, a second sealed gas volume is provided between a second cooling plate and the opposite surface of the planar substrate. This second sealed gas volume can be maintained at a pressure that matches the pressure of the $1^{st}$ sealed gas volume described above. This matching of the pressures on both sides of the substrate has the advantage of preventing bending or deflection of the substrate as well as possible breakage due to excess bending stress.

In accordance with another aspect of the present invention, the second sealed gas volume that is provided between the second cooling plate and the opposite surface of the planar substrate is made in such a manner that there is no contact between the cooling plate and the substrate. This aspect of the present invention prevents damage to any semiconductor thin films on the substrate while eliminating deflection and bending of the substrate.

In accordance with another aspect of the present invention, a low cost heat transfer gas that is the same as the main component of the process gas may be used. This heat transfer gas may be inert dry nitrogen. There is no need to introduce costly heat transfer gases such as helium. This also prevents contamination of the process environment with a foreign gas.

In accordance with another aspect of the present invention, a sealing arrangement such as an o-ring seal serves to restrict gas pressure in the sealed gas volumes.

In accordance with another aspect of the present invention, linear motion of the two cooling plates described above is provided. In this way, both cooling plates can be brought into close proximity with the substrate, and the cooling plates can then be moved away so that the initial substrate can be moved on for further processing and the next substrate to be cooled can be moved into place.

In accordance with another aspect of the present invention, provision is made for pressure control of the sealed gas volumes. The present invention also provides for valving off the gas flow during the periods of time when the substrates are being moved and the sealed gas volumes are open to the surrounding vacuum chamber.

In accordance with another aspect of the present invention, controlled cooling of the cooling plates is provided.

As stated above, the apparatus and process of the present invention provides an economic and advantageous way of cooling large area substrates with adherent thin films in an efficient and cost effective manner. It may be incorporated into a continuous in-line vacuum process in a surrounding vacuum chamber. By cooling substrates in a short cycle time, the present invention permits successive processing of a high volume of substrates in order to maintain a high throughput.

DETAILED DESCRIPTION OF THE PREFERRED EMBODIMENT

Figure 1:
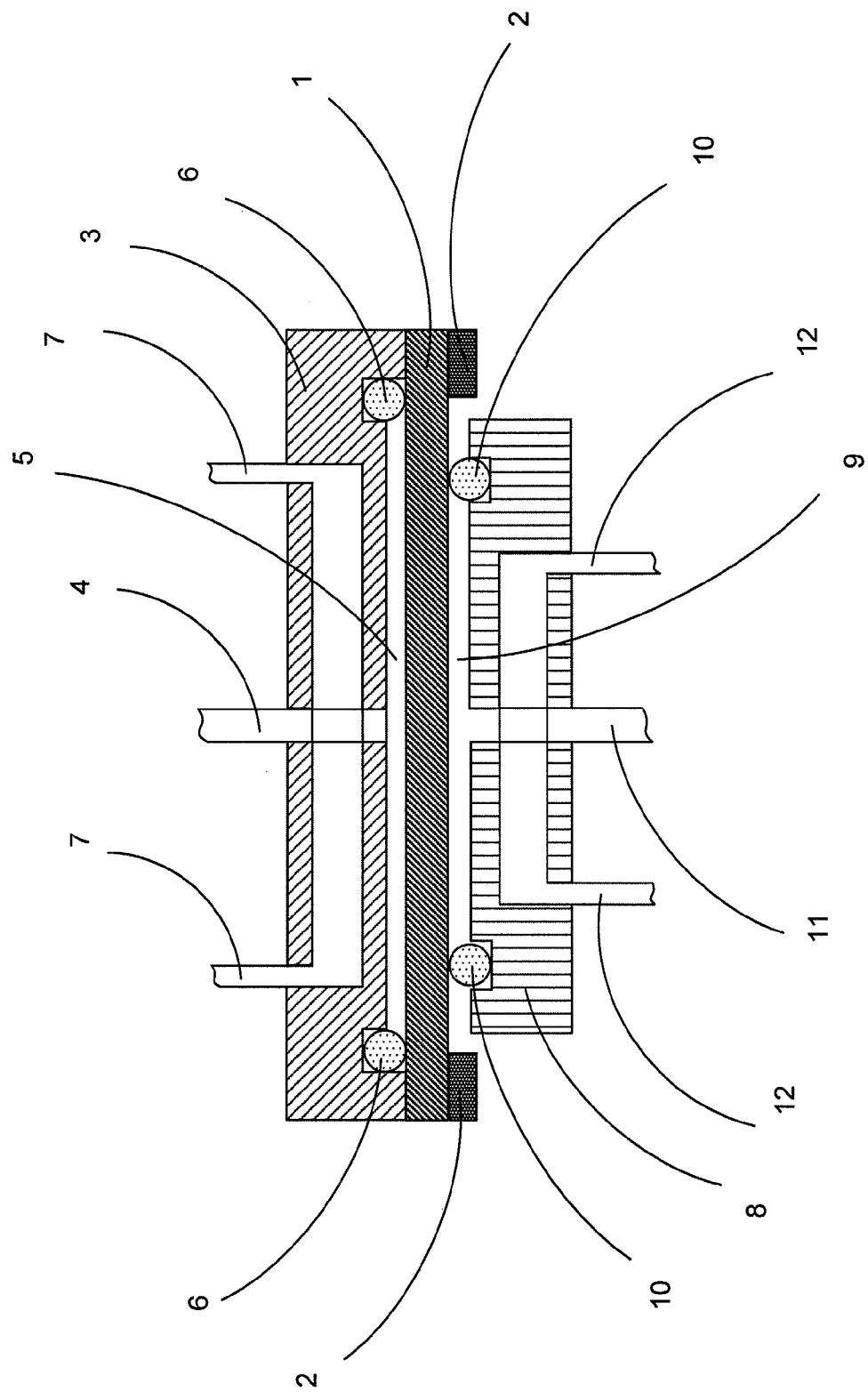
FIG. 1 is a cross-sectional elevation view of the cooling apparatus of the present invention.

Referring now to FIG. 1, there is shown a schematic cross-sectional elevation view of the preferred embodiment of the substrate cooling apparatus of the present invention. The cooling apparatus is enclosed in a surrounding conventional vacuum chamber (not shown). A planar soda lime glass substrate 1 is supported on two metal substrate transport belts 2. These metal transport belts 2 may be of the type described in U.S. Pat. No. 6,423,565 and do not form part of the present invention. Rather, they are shown only for purposes of clarity. The metal transfer belts 2 extend out of the plane of FIG. 1. Upper and lower metal cooling plates 3, 8 are provided above and below substrate 1 and in close proximity to the flat upper and lower surfaces thereof. Upper and lower sealed gas volumes 5, 9 are contained and sealed by o-ring seals 6, 10. Sealed gas volumes 5, 9 are formed between upper and lower cooling plates 3, 8 and above and below substrate 1, respectively. Two gas supply tubes 4, 11 are provided to admit gas under controlled pressure from an external source to each of the sealed gas volumes 5, 9. Two cooling medium supply tubes 7, 12 are connected between an external source of coolant and cavities within each of cooling plates 3, 8 to facilitate controlled cooling of the cooling plates 3, 8. The cooling supply tube 7 passes through the top cooling plate 3 and the cooling supply tube 11 passes through the lower cooling plate 8 so that there are two ends to the cooling supply tubes 7, 11. The cooling plates 3, 8 are adapted to be moved vertically to allow close contact with substrate 1 and to also allow them to be moved away from substrate 1 to facilitate unimpeded horizontal movement of the substrate 1 through the vacuum chamber or other enclosure. A control valve (not shown) is provided in connection with each of the gas supply tubes 4, 11 so that the gas flow may be shut off when the cooling plates 3, 8 are moved away from the substrate 1. Multiple substrates 1 may be passed between the cooling plates 3, 8 to facilitate continuous processing of substrates. When the cooling plates 3, 8 are brought together in close proximity to the upper and lower surfaces of substrate 1, the o-ring seals 6, 10 are compressed to provide the seal necessary to admit gas through the gas supply tubes 4, 11 in order to bring the sealed gas volumes 5, 9 to a higher pressure than that of the surrounding ambient vacuum.

The lower cooling plate 8 must not be in direct contact with the lower surface of substrate 1 since this would harm the thin semiconductor films on that surface. Since the lower cooling plate 8 must be spaced further away from the substrate 1, the cooling rate due to the lower cooling plate 8 will not be as great as the cooling rate from the top cooling plate 3. However, the pressure in the lower sealed gas volume 9 is critical since the pressure in the lower gas volume 9 eliminates any deflection of large area substrates 1 away from the surface of the top cooling plate 3. If there is any deflection of large area substrates 1 away from the top cooling plate 3 the cooling rate will drop significantly. Pressures in the sealed gas volumes 5, 9 are equalized to eliminate the possibility of breaking the glass substrate 1 due to a pressure differential between the upper and lower surfaces thereof.

Any of a number of known cooling mediums can be passed through supply tubes 7, 12 including water. These cooling mediums may be conventionally cooled using chillers or brine baths, for example. The cooling rate of substrate 1 and the end point temperature of the cooling curve are determined by the temperatures of cooling plates 3, 8. These temperatures can be controlled by utilizing conventional PID control methods with a thermocouple control point. The gas pressure in the sealed gas volumes 5, 9 can also be measured and controlled using methods well understood in the art.

It has been found possible to improve the cooling rate of substrate 1 in a vacuum environment by enhancing the conduction cooling mechanism. Thermal conduction may be accomplished through solid contact or through gas phase conduction. This may be shown by placing the cooling plates 3, 8 in close proximity to the substrate 1 and increasing the ambient gas pressure in the sealed gas volumes 5, 9 between the cooling plates 3, 8 and the substrate 1. The heat transfer away from substrate 1 may be optimized in any of several ways. First, the cooling plates 3, 8 are preferably constructed of a material having high thermal conductivity, such as copper, so that excess heat is transferred away quickly. The surfaces of the cooling plates 3, 8 that face substrate 1 are preferably polished so that the surface roughness of the cooling plates 3, 8 is low. The spacing between the cooling plates 3, 8 and substrate 1 should be as small as possible. Preferably, the upper cooling plate 3 is in direct contact with the upper surface of substrate 1, with the average distance being approximately 0.005 inches or less. In this way, for any microscopically rough surface, the high points will be in contact and increase the probability of contact conduction. The lower cooling plate 8 of FIG. 1 must not be in direct contact with the lower surface of substrate 1 since this would harm the thin semiconductor films on that surface. As the ambient gas pressure in the sealed gas volumes 5, 9 is increased, the distance between the gas atoms decreases, and the probability of a collision between the gas atoms and the surrounding walls increases. These collisions of the gas atoms or molecules with the hot substrate 1 and the cold cooling plates 3, 8 increase the heat transfer from the substrate 1. The heat transfer due to the gas collisions are a form of conduction heat transfer through the gas phase in a confined space. In this case, there will be no convection currents or fluid flow in the gas, only random collisions of the gas atoms or molecules.

Figure 2:
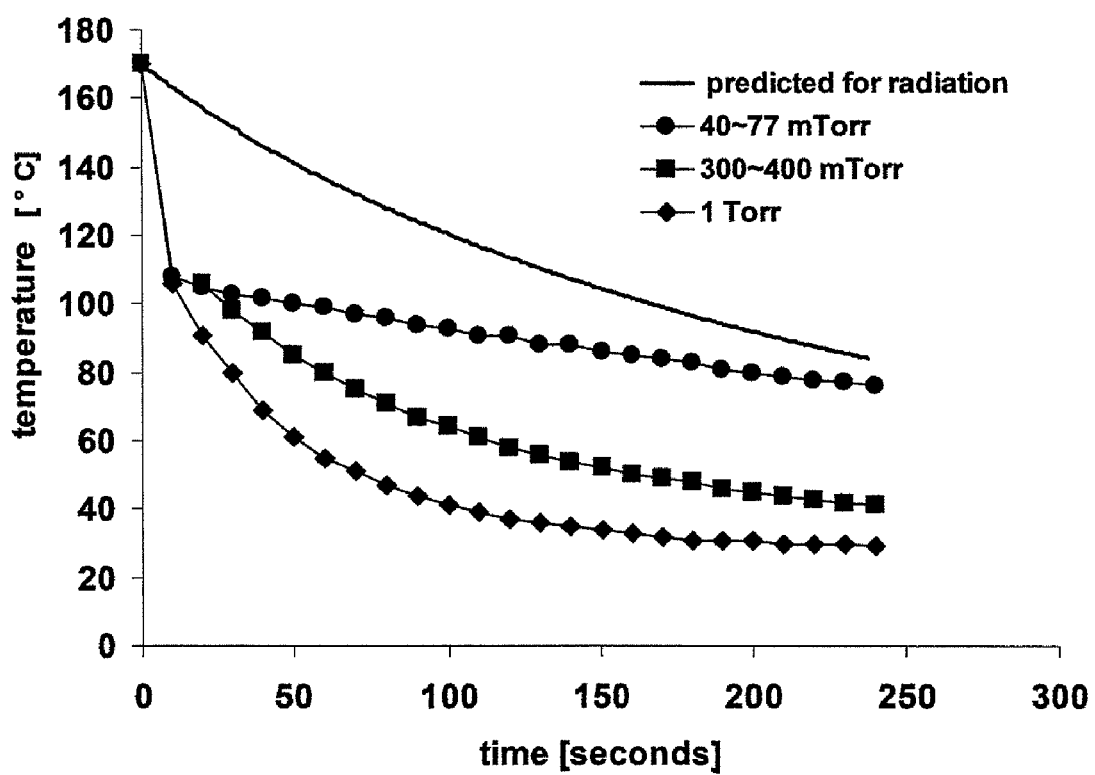
FIG. 2 is a plot of temperature versus time illustrating the measured cooling rates of a soda lime glass substrate for various gas pressures in a sealed gas volume utilizing the cooling apparatus of the present invention and also illustrating a plot of an estimated cooling rate utilizing prior art radiation cooling.

In order to illustrate the thermal efficiency of the present invention, a prototype test fixture was used to demonstrate that a soda lime glass substrate can be cooled from 170° C. to 37° C. in a two-minute time period and to 29° C. in a four-minute time period. The measured cooling rates of a soda lime glass substrate are shown in FIG. 2. The topmost curve in FIG. 2 is a predicted cooling rate for thermal radiation cooling of a glass substrate calculated by a finite difference analysis. The other three curves in FIG. 2 show the effect of increasing the gas pressure intervening space between the single top cooling plate 3 and a substrate 1. In this test prototype no o-ring seals 6 were used. In this prototype no deflection or stress was introduced so the lower cooling plate 8 was not required. As the gas pressure was increased from 40 mTorr to 1 Torr, the cooling rate increased significantly. The following parameters produced the test results shown in FIG. 2: 1) the distance between the cooling plate 3 and the substrate 1 was at most 0.005. in., with the surfaces thereof being in direct contact at some points; and 2) the temperature of the cooling plate 3 was approximately 20° C. The results shown in FIG. 2 demonstrate the efficiency of the current invention compared to thermal radiation cooling alone. In the working system the cooling rate can be increased by decreasing the temperature of the cooling plates 3, 8 below 20° C. and by using a combination of both cooling plates 3, 8. Another way to increase the cooling rate is to increase the pressure in the sealed gas volumes 5, 9 to pressures on the order of 10 Torr.

What is claimed is:

1. An apparatus for cooling a planar substrate positioned in a vacuum enclosure, the apparatus comprising:
   support means for supporting the substrate within the vacuum enclosure, the substrate having a first surface and an opposite second surface, the second surface having one or more adherent films thereon;
   a first cooling plate positioned proximate the first surface of the substrate, a first spatial volume being formed between the first cooling plate and the first surface of the substrate;
   a second cooling plate positioned proximate the second surface of the substrate, a second spatial volume being formed between the second cooling plate and the second surface of the substrate;
   means for sealing the first and second spatial volumes from an ambient pressure environment within the vacuum enclosure;
   means for admitting a gas under controlled pressure conditions from an external source into the first and second spatial volumes such that the pressure of the gas in the first spatial volume is substantially equal to the pressure of the gas in the second spatial volume; and
   means for controllably cooling the first and second cooling plates.

2. Apparatus as in claim 1, wherein:
   the support means is operative for supporting the substrate in a horizontal position such that the first surface of the substrate comprises an upper surface and the second surface comprises a lower surface;
   the first cooling plate has a lower horizontal surface positioned proximate the upper surface of the substrate; and
   the second cooling plate has an upper horizontal surface positioned proximate the lower surface of the substrate.

3. Apparatus as in claim 1, wherein a distance between the first surface of the substrate and the first cooling plate is smaller than a distance between the second surface of the substrate and the second cooling plate.

4. Apparatus as in claim 1, wherein the first cooling plate is positioned to directly contact the first surface of the substrate at one or more points thereon.

5. Apparatus as in claim 1, wherein the second cooling plate is positioned to avoid direct contact with the second surface of the substrate.

6. Apparatus as in claim 1, further comprising:
   a coolant cavity formed within each of the first and second cooling plates; and
   a coolant supply means coupled between the cooling cavities and an external source of coolant for circulating the coolant through the coolant cavities.

7. Apparatus as in claim 6, wherein the coolant comprises water.

8. Apparatus as in claim 1, wherein the substrate comprises a soda lime glass substrate.

9. Apparatus as in claim 1, wherein the means for sealing the first and second spatial volumes comprises a pair of o-ring seals.

10. Apparatus as in claim 1, wherein the first and second cooling plates comprise a thermally conductive material.

11. Apparatus as in claim 2, wherein the lower horizontal surface of the first cooling plate and the upper horizontal surface of the second cooling plate are polished.

12. An apparatus for cooling a substrate, the apparatus comprising:
- a first cooling plate positioned proximate a first surface of a substrate;
- a second cooling plate positioned proximate a second surface of the substrate;
- a first seal, wherein the first seal is configured to form a first spatial volume between the first cooling plate and the substrate;
- a second seal, wherein the second seal is configured to form a second spatial volume between the second cooling plate and the substrate;
- a first gas supply configured to supply gas to the first spatial volume; and
- a second gas supply configured to supply gas to the second spatial volume.

13. The apparatus of claim 12, wherein:
the first gas supply and the second gas supply are configured to maintain a gas pressure in the first spatial volume that is substantially equal to a gas pressure in the second spatial volume.

14. The apparatus of claim 12, wherein:
the second gas supply is configured to maintain a gas pressure in the second spatial volume sufficient to prevent deflection of the substrate.

15. The apparatus of claim 12, wherein:
the first gas supply and the second gas supply are part of the same gas supply.

16. The apparatus of claim 12, wherein:
the first seal comprises an o-ring; and
the second seal comprises an o-ring.

17. The apparatus of claim 12, wherein:
the second cooling plate and the second seal are configured to prevent contact between the second cooling plate and the substrate.

18. The apparatus of claim 12, wherein:
the first cooling plate and the first seal are configured to allow contact between the second cooling plate and the substrate.

19. The apparatus of claim 12, wherein:
a surface of the first cooling plate proximate to the substrate is polished; and
a surface of the second cooling plate proximate to the substrate is polished.

* * * * *